(12) United States Patent
Apte et al.

(10) Patent No.: US 11,515,465 B2
(45) Date of Patent: Nov. 29, 2022

(54) EMI REDUCTION IN PIEZOELECTRIC MICROMACHINED ULTRASOUND TRANSDUCER ARRAY

(71) Applicant: INVENSENSE, INC., San Jose, CA (US)

(72) Inventors: Nikhil Apte, Palo Alto, CA (US); Chienliu Chang, Los Altos, CA (US); Shreyas Thakar, San Jose, CA (US); Mei-Lin Chan, Milpitas, CA (US)

(73) Assignee: INVENSENSE, INC., San Jose, CA (US)

( * ) Notice: Subject to any disclaimer, the term of this patent is extended or adjusted under 35 U.S.C. 154(b) by 870 days.

(21) Appl. No.: 16/281,792

(22) Filed: Feb. 21, 2019

(65) Prior Publication Data

US 2019/0267536 A1 Aug. 29, 2019

Related U.S. Application Data (60) Provisional application No. 62/635,486, filed on Feb. 26, 2018.

(51) Int. Cl.
| | |
|---|---|
| *H01L 41/047* | (2006.01) |
| *H01L 41/09* | (2006.01) |
| *B06B 1/06* | (2006.01) |
| *B81B 7/00* | (2006.01) |
| *G01N 29/24* | (2006.01) |
| *B81B 3/00* | (2006.01) |

(52) U.S. Cl.
CPC ........ *H01L 41/0926* (2013.01); *B06B 1/0622* (2013.01); *B06B 1/0688* (2013.01); *B81B 3/0021* (2013.01); *B81B 7/0064* (2013.01); *G01N 29/2437* (2013.01); *H01L 41/047* (2013.01)

(58) Field of Classification Search
CPC .. H01L 41/0926; H01L 41/047; B06B 1/0622
See application file for complete search history.

(56) References Cited

U.S. PATENT DOCUMENTS

| | | | |
|---|---|---|---|
| 6,776,758 B2 | 8/2004 | Peszynski | |
| 2007/0126315 A1* | 6/2007 | Scott | G06V 40/10 310/318 |
| 2014/0219063 A1* | 8/2014 | Hajati | B06B 1/0292 310/334 |
| 2015/0284240 A1* | 10/2015 | Chu | B81C 1/00293 438/51 |
| 2016/0107194 A1* | 4/2016 | Panchawagh | H01L 41/047 310/317 |
| 2016/0117541 A1* | 4/2016 | Lu | G06V 40/1306 382/124 |
| 2017/0322290 A1* | 11/2017 | Ng | A61B 8/4483 |
| 2017/0328866 A1* | 11/2017 | Apte | B06B 1/0622 |
| 2017/0365774 A1* | 12/2017 | Rothberg | H01L 41/047 |

\* cited by examiner

*Primary Examiner* — Bryan P Gordon
(74) *Attorney, Agent, or Firm* — Haley Guiliano LLP; Joshua Van Hoven; Stefan D. Osterbur (57) ABSTRACT

A piezoelectric micromachined ultrasound transducer (PMUT) array may comprise PMUT devices with respective piezoelectric layers and electrode layers. Parasitic capacitance can be reduced when an electrode layer is not shared across PMUT devices but may expose the devices to electromagnetic interference (EMI). A conductive layer located within the structural layer or on a shared plane with the electrode layers may reduce EMI affecting the PMUT array operation.

20 Claims, 5 Drawing Sheets

EMI REDUCTION IN PIEZOELECTRIC MICROMACHINED ULTRASOUND TRANSDUCER ARRAY

FIELD OF INVENTION

This application relates to a piezoelectric micromachined ultrasound transducer (PMUT) device and more specifically, to electromagnetic interference (EMI) shielding in the PMUT device.

CROSS-REFERENCE TO RELATED APPLICATIONS

This application claims priority benefit under 35 U. S. C. § 119(e) from U.S. provisional application No. 62/635,486, entitled "Ground Shielding for MEMS Sensor," filed on Feb. 26, 2018. The aforementioned, earlier-filed application is hereby incorporated by reference herein in its entirety.

BACKGROUND

A piezoelectric micromachined ultrasound transducer (PMUT) device may be utilized in a variety of applications. The PMUT device may include a piezoelectric material that provides an electro-mechanical response based on a given input signal. For example, when an electrical signal is applied to the piezoelectric material, the material may exhibit a mechanical response. In response to a received mechanical signal, the piezoelectric material may exhibit an electrical response.

One application of PMUT devices may be in ultrasonic applications. By designing the PMUT device or multiple PMUT devices in a particular manner, desired signals may be produced and/or sensed. An exemplary sensor that utilizes PMUT technology may be a PMUT fingerprint sensor. Portions of an array of PMUT devices may be selectively activated by electrical signals to output corresponding ultrasonic signals that are transmitted in the direction of a finger. Portions of the array of PMUT devices may also be selectively activated to sense the reflections of the transmitted ultrasonic signal based on the electrical output due to the mechanical forces exerted by the reflected signals. A suitable number of PMUT devices and arrays may be implemented to measure the contours of the user's fingerprint based on the reflected signals.

A PMUT sensor may thus include a complex configuration of PMUT devices and arrays based on a variety of applications such as fingerprint sensing, and in a variety of end-products such as small portable devices. As PMUT sensors increase in complexity and are utilized in an ever-increasing number of applications and environments, PMUT sensors regularly encounter challenging environmental conditions such as electromagnetic interference (EMI).

SUMMARY

In an embodiment of the present disclosure, an array of piezoelectric micromachined ultrasound transducer (PMUT) devices may comprise an electrical component layer and PMUT transceivers. Each of the PMUT transceivers may further comprise a piezoelectric layer, a structural layer, electrodes, and a conductive layer. The piezoelectric layer may be located between the electrical component layer and the structural layer. A first electrode, located between the structural layer and the piezoelectric layer, can be electrically connected to the piezoelectric layer and to the electrical component layer. A second electrode, located between the electrical component layer and the piezoelectric layer, can be electrically connected to the piezoelectric layer and to the electrical component layer. The conductive layer may be located above each of the piezoelectric layers and within the structural layer.

In an embodiment of the present disclosure, an array of piezoelectric micromachined ultrasound transducer (PMUT) devices may comprise an electrical component layer and PMUT transceivers. Each of the PMUT transceiver may further comprise a piezoelectric layer, a structural layer, electrodes, and a conductive layer. The piezoelectric layer can be located between the electrical component layer and the structural layer. A first electrode, located between the structural layer and the piezoelectric layer, can be electrically connected to the electrical component layer and the piezoelectric layer. A second electrode, located between the electrical component layer and the piezoelectric layer, can be electrically connected to the electrical component layer and the piezoelectric layer. The conductive layer may be located in a shared plane with the second electrode.

BRIEF DESCRIPTION OF DRAWINGS

The above and other features of the present disclosure, its nature and various advantages will be more apparent upon consideration of the following detailed description, taken in conjunction with the accompanying drawings in which.

DETAILED DESCRIPTION OF DRAWINGS

Microelectromechanical systems (MEMS) may refer to a class of structure or devices fabricated using semiconductor-like processes and exhibiting mechanical characteristics such as the ability to move or deform. MEMS often, but not always interact with electrical signals. MEMS devices include, but are not limited to, gyroscopes, accelerometers, magnetometers, pressure sensors, and radio-frequency components. Silicon wafers containing MEMS structures may be referred to as MEMS layers.

Fingerprint sensing through MEMS devices may be achieved through an array of piezoelectric micromachined ultrasound transducer (PMUT) devices, and an array of cavities that has been attached to the array of piezoelectric transducers to form an array of resonators, e.g., an array of MEMS piezoelectric acoustic resonators. A resonator, e.g., a membrane resonator, a Helmholtz resonator, etc. of the array of resonators can be associated with a first frequency response, e.g., a resonant frequency of the resonator, a Q factor of the resonator, etc. corresponding to a determination that the resonator has a non-touch baseline condition. Then a second frequency response, e.g., increase in resonant frequency of the resonator, decrease in Q factor of the resonator, etc. corresponding to a determination that the resonator has been touched, e.g., by the finger ridge. Thus, the finger print map can be determined according to the frequency response changes of resonators in the resonator array.

A piezoelectric material such as PZT of the PMUT device may be fabricated within a particular portion of the PMUT device and may be located adjacent to a variety of other materials and components of the PMUT device. For example, a layer of piezoelectric material may be located and patterned in a manner to provide a desired acoustic output and/or to accurately receive reflected acoustic signals. In some embodiments, conductive electrodes may be electrically coupled on each side of the piezoelectric material and coupled to respective electrical circuitry (e.g., at an external or understanding electrical layer such as a CMOS layer) such that an electrical signal may be applied across the piezoelectric material or sensed from piezoelectric material. In this manner, the piezoelectric material may provide an electrical connection between respective electrodes.

In some embodiments, one or both of the electrodes on respective sides of the piezoelectric material may be shared across PMUT devices. In other embodiments, one or both of the electrodes may be patterned such that each PMUT device has individual access to the electrode or electrodes (e.g., the electrode is not electrically connected to adjacent PMUT devices). When the electrode is not shared across PMUT devices, the individual access may provide a performance boost to the PMUT device by reducing parasitic capacitance. Further, in some embodiments one or both of the electrodes may be electrically connected to electrical components in another portion of the sensor such as an electrical component layer, for example to exchange electrical signals between the electrical component layer and the piezoelectric material. Switching within the electrical component layer may selectively cause the PMUT to operate as a transmitter or receiver, and to receive particular signals or signal patterns. Complex PMUT devices may be susceptible to electromagnetic interference (EMI), for example, without a large electrode patterned over the piezoelectric material, without the overlying electrode shared across PMUT devices, and where the overlying electrode is not grounded. Each of these and other related design features may reduce the EMI shielding of the overlying electrode.

In some embodiments of the present disclosure, a PMUT structure may include design features to provide EMI reduction while retaining complex design features. In some embodiments, a conductive material may be provided in a layer or patterned at particular locations relative to portions of the PMUT structures that may be sensitive to EMI. For example, a grounded conductive layer may be one or more portions of material that partially overly or surround sensitive PMUT features such as the piezoelectric material and one or more of the electrodes. In some embodiments, the conductive layer may be a continuous layer that spans multiple PMUT devices. In some embodiments, the conductive layer may be patterned or in a mesh arrangement such that the area between PMUT devices contains a conductive path to ground for incoming EMI, thereby reducing the EMI directed at the PMUT devices. In some embodiments, the conductive layer may be one of the electrodes of the PMUT device, or may be electrically connected to the PMUT device.

Figure 1:
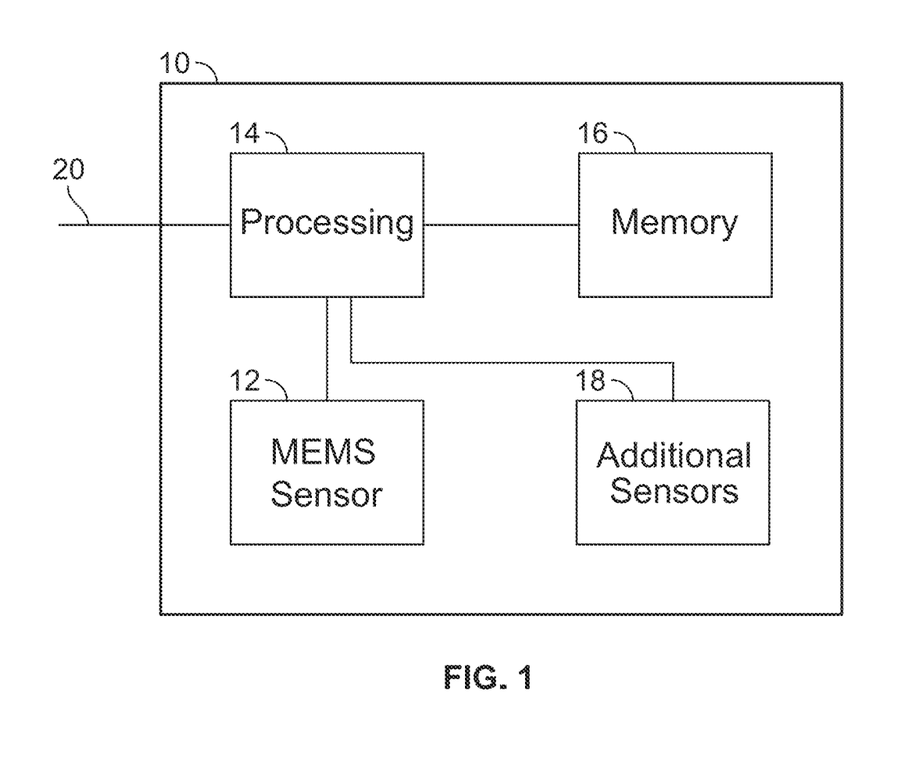
FIG. 1 depicts an exemplary fingerprint sensing system in accordance with some embodiments of the present disclosure.

FIG. 1 depicts an exemplary PMUT sensor system such as a fingerprint sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the PMUT sensor system may include at least a MEMS piezoelectric sensor 12 and supporting circuitry, such as processing circuitry 14 and memory 16. In some embodiments, one or more additional sensors 18 (e.g., MEMS gyroscopes, MEMS accelerometers, MEMS pressure sensors, and a compass) may be included within the fingerprint sensing system 10 to provide an integrated identification and movement processing unit (e.g., including 3 axes of MEMS gyroscope sensing, 3 axes of MEMS accelerometer sensing, pressure sensor, and compass).

Processing circuitry 14 may include one or more components providing necessary processing based on the requirements of the fingerprint processing system 10. In some embodiments, processing circuitry 14 may include hardware control logic that may be integrated within a chip of a sensor (e.g., on a substrate or cap of a MEMS piezoelectric sensor 12 or additional sensors 18, or on an adjacent portion of a chip to the MEMS piezoelectric sensor 12 or additional sensors 18) to control the operation of the MEMS piezoelectric sensor 12 or additional sensors 18 and perform aspects of processing for the MEMS piezoelectric sensor 12 or additional sensors 18. In some embodiments, the MEMS piezoelectric sensor 12 and additional sensors 18 may include one or more registers that allow aspects of the operation of hardware control logic to be modified (e.g., by modifying a value of a register). For example, in some embodiments one, or registers may be modified to change values (e.g., resistors, capacitors, filters, etc.) associated with the processing circuitry described herein. In some embodiments, processing circuitry 14 may also include a processor such as a microprocessor that executes software instructions, e.g., that are stored in memory 16. The microprocessor may control the operation of the MEMS piezoelectric sensor 12 by interacting with the hardware control logic, and process signals received from MEMS piezoelectric sensor 12. The microprocessor may interact with other sensors in a similar manner.

Figure 2:
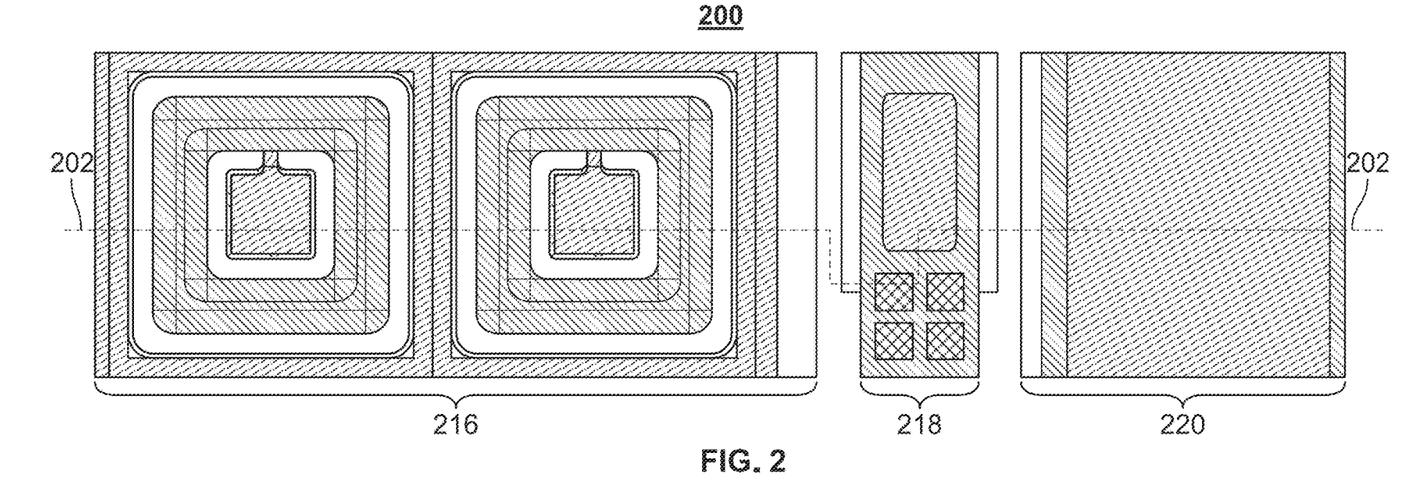
FIG. 2 shows a top view of a PMUT structure in accordance with some embodiments of the present disclosure.

FIG. 2 shows a top view of a PMUT structure 200 in accordance with some embodiments of the present disclosure. PMUT structure 200 may comprise PMUT devices 216, a ground contact area 218, and a MEMS seal ring 220. The PMUT devices 216 react to mechanical stress by generating an electrical signal that carries sensing information, or generate a mechanical force (e.g., as an ultrasonic signal) in response to a provided electrical signal. In an exemplary embodiment of a PMUT device used for fingerprint applications, a transmitting PMUT receives an electrical signal having a particular pattern (e.g., a periodic signal or signal otherwise modulated for desirable transmission, reception, and noise characteristics) that is transmitted in the direction of a surface for receiving a finger. An exemplary receiving PMUT device receives a reflection of the transmitted ultrasonic signal, with the received ultrasonic signal and resulting electrical signal output by the receiving PMUT being modulated based on the ridges of the user's fingerprint (e.g., based on the return distance from the ridge of the user's finger).

The ground contact area 218 can provide a path to ground for EMI incoming to the PMUT devices 216. Though not pictured in FIG. 2, there may be an EMI shield across the PMUT devices 218 that connects to ground at the ground contact area 218. As referred to herein, the term "EMI shield" should be understood to mean a conductive layer positioned such that EMI directed at the piezoelectric layer and/or electrodes is reduced. The MEMS seal ring 220 may provide an area to section the PMUT structure 200 from other structures. In some instances, the MEMS seal ring 220 is distanced from the PMUT devices 218 in order to reduce corrosion once a cut at the MEMS seal ring 220 exposes the layers of the PMUT structure 220 that have not been protected from the exterior environment (e.g., by a passivation layer).

Figure 3:
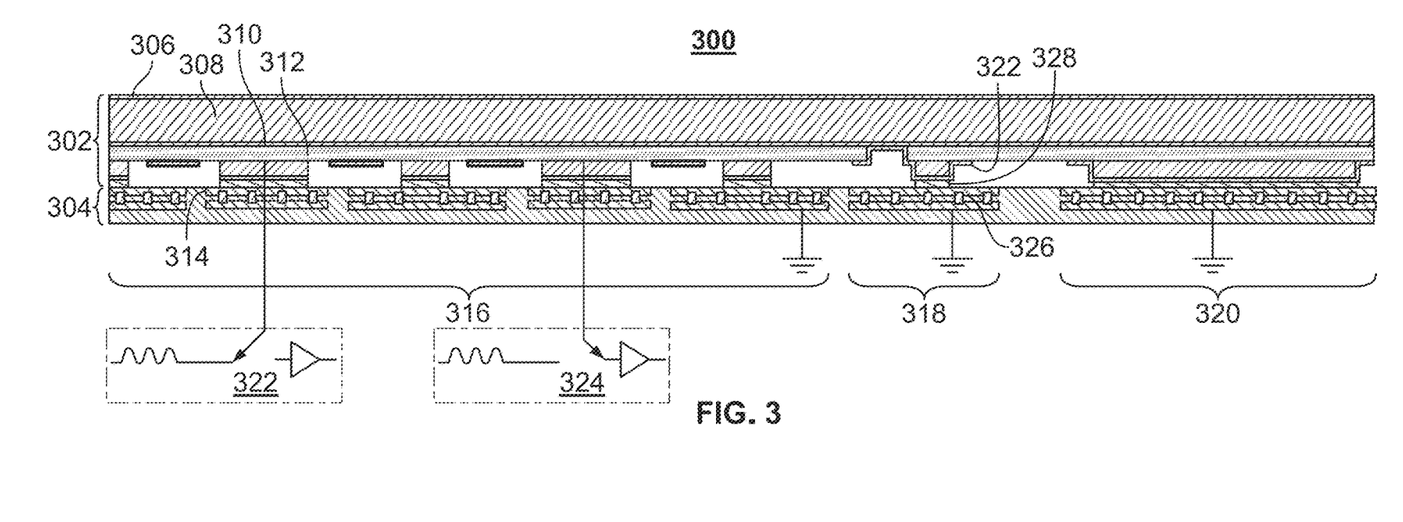
FIG. 3 shows a cross-sectional view of a PMUT structure in accordance with some embodiments of the present disclosure.

FIG. 3 shows a cross-sectional view of a PMUT structure 300 in accordance with some embodiments of the present disclosure. The cross-sectional view of PMUT structure 300 can be obtained from the top view of FIG. 2 by following the section line 202 as shown traveling across the top view of FIG. 2. In some embodiments, the PMUT structure 300 comprises a MEMS layer 302 and an electrical component layer (e.g., CMOS layer 304). The MEMS layer 302 can further comprise a passivation layer 306 to prevent or deter corrosion that may be composed of silicon dioxide. The MEMS layer 302 may comprise a structural layer 308 to provide structural support for the PMUT structure 300 and may be composed of a suitable material having limited conductivity (e.g., poly-silicon). In an embodiment, a MEMS layer 302 can comprise an EMI shield 310. The EMI shield 310 may be composed of a suitable conductive material such as molybdenum.

The EMI shield 310 may be located such that it is substantially interposed between the active components of the MEMS sensor and likely sources of EMI (e.g., in an exemplary fingerprint sensor, an exposed upper portion of the MEMS sensor for positioning of a user's finger). In the exemplary embodiment depicted in FIG. 3, the EMI shield substantially overlies all the active components. An exemplary active component can be a piezoelectric layer 312 between two conductive electrode layers. In an exemplary embodiment, one of these two electrode layers is the EMI shield 310 and is grounded. In such an embodiment, the connection to the other electrode or electrodes on the other side of the piezoelectric layer 312 may determine whether a particular PMUT device transmits or receives the ultrasonic signal. For example, bonding may occur between the MEMS layer 302 and CMOS layer 304 at locations such as contact 314. Each bonding location may correspond to a transmit function 322 or receive function 324.

The PMUT structure 300 may comprise PMUT devices 316, a ground contact area 318, and a MEMS seal ring 320. At the ground contact area 318, the ground layer 310 may have a path to ground. In some embodiments, there is an electrical connection between the ground layer 310, electrode 322, a bonding layer (e.g., Germanium or other suitable materials) 324, and contact 326 such that the EMI from outside of the PMUT structure 300 may be directed to ground instead of affecting the operation of the PMUT structure 300. The MEMS seal ring 320 may provide an area to section the PMUT structure 300 into dies for further assembly. For example, the PMUT structure 300 can be sectioned by a cut anywhere in the MEMS seal ring 320 such that the PMUT devices 316 can be a part of a user device while the PMUT devices, not depicted, on the other side of the sectioning can be part of another user device.

Figure 4:
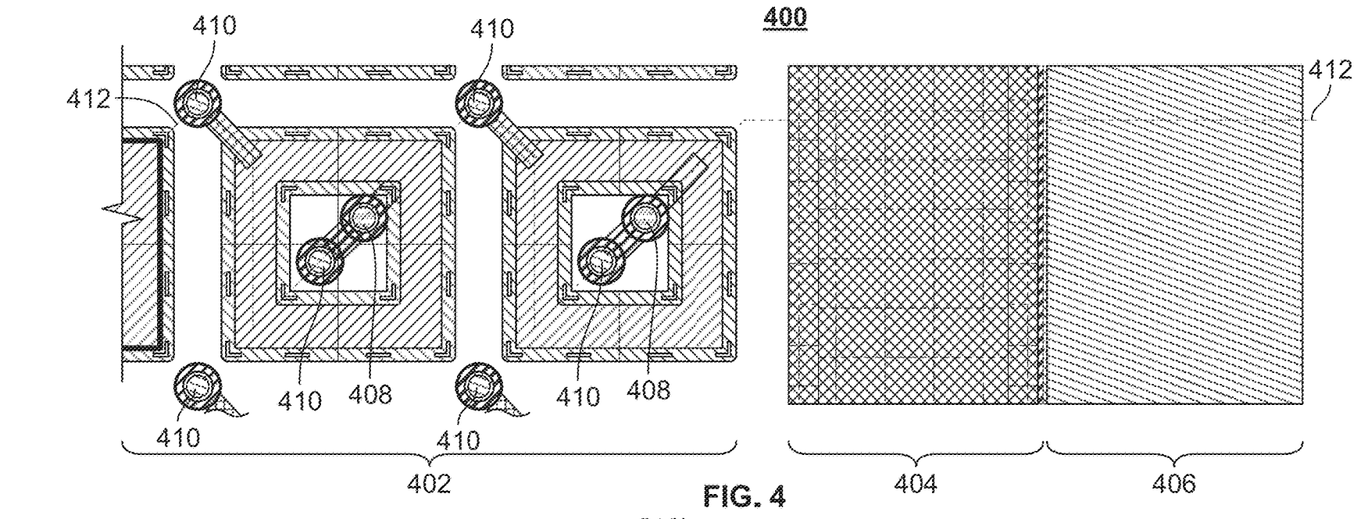
FIG. 4 shows a top view of a PMUT structure having switching on both top and bottom electrodes in accordance with some embodiments of the present disclosure.

FIG. 4 shows a top view of a PMUT structure 400 having reduced EMI in accordance with some embodiments of the present disclosure. The PMUT structure 400 may comprise PMUT devices 402 that form an array of devices, wherein each device may perform either a transmit function or receive function. In an embodiment, additional EMI shielding may be provided at a suitable location (e.g., between an exposed surface to receive an input from user and the active piezoelectric components) at one or more additional locations within layers associated with the active components, or a combination thereof. The PMUT structure 400 may further comprise a MEMS seal ring 406 that can be separated from the PMUT devices 402 by a region 404. Each device in the PMUT devices 402 may comprise a MEMS layer, a CMOS layer, and a cavity between the two layers that is created by standoffs located at areas of contact between the MEMS and CMOS layers. A PMUT device may have at least one standoff, and the standoffs may be located between two adjacent PMUT devices and/or may be located central to the device.

Via structures provide an electrical path between active components of the MEMS sensor, such as between electrodes of the PMUT device or between the MEMS layer and the CMOS layer. In an exemplary embodiment, different types of via structures may be utilized for different connections within the MEMS sensor. The first type of via structure 408 electrically connects between active portions of the PMUT devices, for example, to electrically connect a first electrode of the MEMS layer and a second electrode of the MEMS layer through a third electrode. An exemplary second type of via structure 410 electrically connects between the MEMS layer and the CMOS layer. For example, the second type of via structure 410 may connect an electrode of the MEMS layer to a contact of a CMOS layer that is associated with a transmit function and/or receive function. When the second type of via structure connects to a contact associated with a receive function, a third electrode may connect the first electrode and second electrode. Alternatively, the second type of via structure 410 may connect an electrode of the MEMS layer to a contact of a CMOS layer that is associated with ground.

In an embodiment, the MEMS seal ring 406 may be located at a distance relative to the PMUT devices in order to maintain the structural integrity of the areas of the PMUT structure 400 that comprise the active components that are critical to the sensor. The MEMS seal ring 406 provides an area to section the PMUT structure 400. For example, the PMUT structure 400 can be sectioned by a cut anywhere in the MEMS seal ring 406 such that the PMUT devices 402 can be a part of a user device while the PMUT devices, not depicted, on the other side of the sectioning can be a part of another user device. The MEMS seal ring 406 may be grounded.

Figure 5:
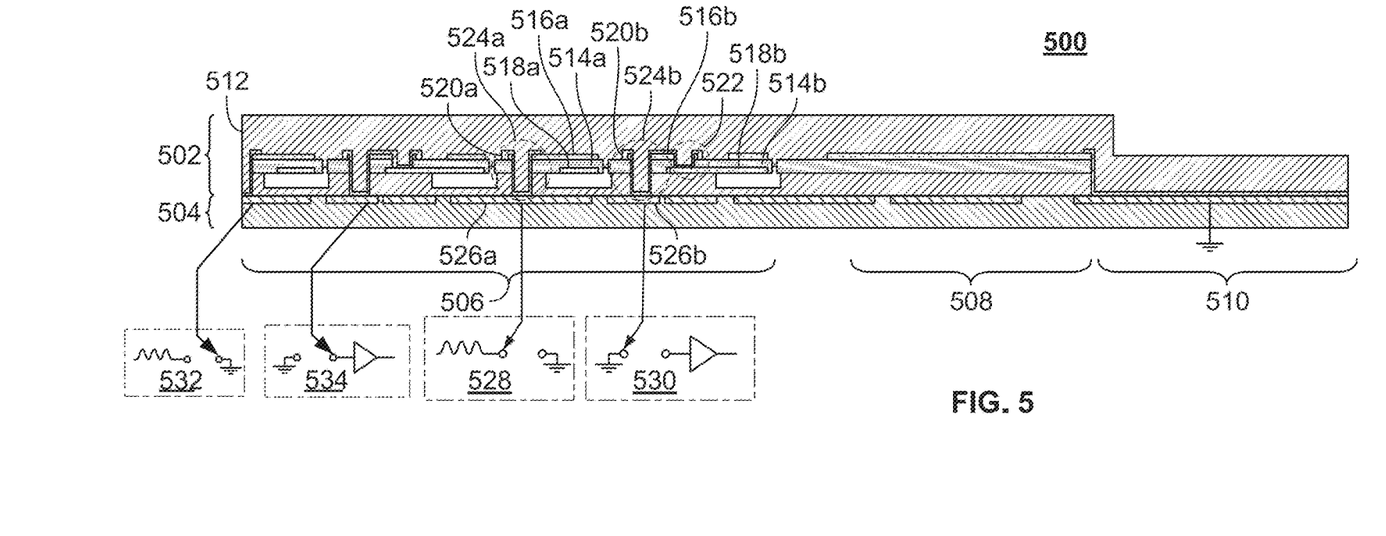
FIG. 5 shows a cross-sectional view of a PMUT structure having switching on both top and bottom electrodes in accordance with some embodiments of the present disclosure.

FIG. 5 shows a cross-sectional view of a PMUT structure 500 in accordance with some embodiments of the present disclosure. The cross-sectional view of FIG. 5 corresponds to the top view of FIG. 4 along section line. The PMUT structure can be obtained by bonding a MEMS layer 502 and an electrical component layer (e.g., CMOS layer 504) with a eutectic bond. In one embodiment, the PMUT structure 500 comprises PMUT devices 506 and a MEMS seal ring 510. A region 508 may be located between the MEMS seal ring 510 and the PMUT devices 506, with no via structures between the MEMS layer 502 and the CMOS layer 504 within the region 508. The MEMS layer 502 can comprise a silicon handle layer 512, a piezoelectric layers 514a and 514b, first electrode 516a and/or 516b, second electrodes 518a and/or 518b, and connector 520a and/or 520b. The piezo layers 514a and 514b can be portions of a continuous piezo layer. As depicted in FIG. 5, first electrodes 516a/516b and second electrodes 518a/518b are located on respective sides of piezoelectric layers 514a/514b, while connector 520a/520b electrically connect the MEMS layer 502 to a CMOS layer 504

In some instances, the MEMS layer 502 comprises a first type of via structure 522 and a second type of via structure 524a and/or 524b. A first type of via structure 522 may connect the first electrode 516b to the second electrode 518b. A second type of via structure 524a may connect an electrode of the MEMS layer 502 to a contact 526a of a CMOS layer 504 that is associated with a transmit function 528 or receive function 534. A PMUT device in a transmit mode may have a CMOS layer 504 associated with a transmit function 528 and disassociated with a receive function through a ground 530. Alternatively, a PMUT device in a receive mode may have a CMOS layer 504 associated with a receive function 534 and disassociated with a transmit function through a ground 532. The connector 520b may further electrically connect the first electrode 516b of the MEMS layer 502, the second electrode 518b of the MEMS layer 502, and a contact 526b of the CMOS layer 504 together to create a path for current from the second electrode 518b of the MEMS layer to the contact 526b of the CMOS layer 504. In response to a mechanical stress (e.g., a received ultrasonic signal reflected from ridges of a fingerprint) received by the piezoelectric layer 514b, piezoelectric layer 514b may generate an electrical signal between the first electrode 516b and the second electrode 518b. This electrical signal may then travel through the third electrode 520b to be received by the CMOS layer 504 at the contact 526b.

In some embodiments, the connection between the contact 526a and the first electrode 516a may allow the PMUT device to transmit an electrical signal from the CMOS layer 504 to the MEMS layer 502. The path traveled by the electrical signal can be established with the first type of via structure 524a. Specifically, this electrical signal can be transmitted to the first electrode 516a and through the piezoelectric layer 514a. In doing so, the piezoelectric layer 514a may generate a mechanical response (e.g., a vibration) caused by the electrical signal applied between the first electrode 516a and the second electrode 518a.

The PMUT structure 500 can further comprise a MEMS seal ring 510 and a region 508 that distances the MEMS seal ring 510 from the PMUT devices 506. The MEMS seal ring 510 may be grounded by associating the contact on the CMOS layer 504 with ground before the MEMS layer 502 and the CMOS layer 504 are bonded.

Figure 6:
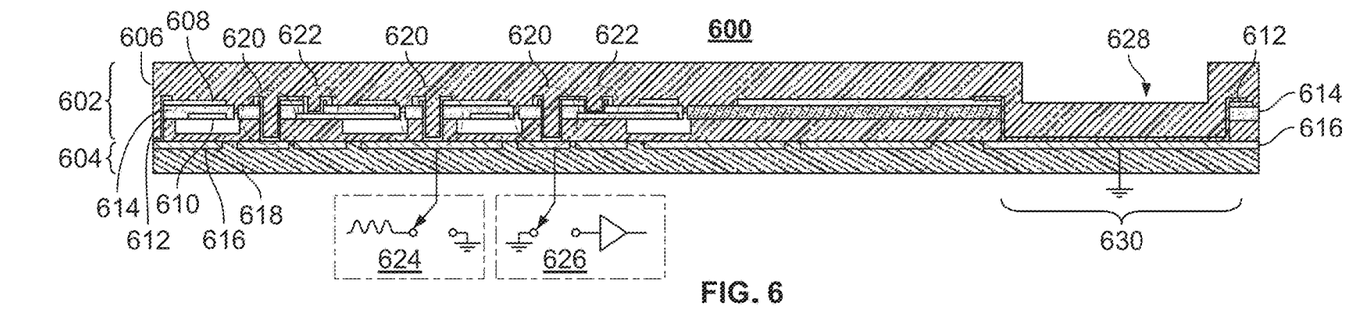
FIG. 6 shows a cross-sectional view of a piezoelectric PMUT structure in accordance with some embodiments of the present disclosure.

FIG. 6 shows a cross-sectional view of a piezoelectric PMUT structure 600 in accordance with one embodiment of the present disclosure. The MEMS layer 602 can comprise a silicon device layer 606 and a dielectric vibrating area or membrane grown over it. This dielectric vibrating area may comprise piezoelectric layer 614 between electrode layer 608 and electrode layer 610. Connector 612, grown as a part of the MEMS layer 602, makes electrical contact with the contacts 616 of an electrical component layer (e.g., CMOS layer 604). The contacts 616 may be composed of a suitable conductive material such as aluminum. The CMOS layer 604 may comprise contacts 616 and a substrate 618. The electrode layers 608 and 610 of the dielectric vibrating area can connect to the contacts 616 of the CMOS layer 604 through different via structures. In some embodiments, there are two via types. The first type of via 620 connects the two electrode layers 608 and 610 (e.g., the first type of via enables electrical connectivity between electrode layers 608 and 610). The second type of via 622 connects the electrode layer 608 to the contacts 616. At each second type of via 620, an electrical signal may be communicated between the MEMS layer 602 and the CMOS layer 604. In some embodiments, the second type of via 620 may be associated with transmit configuration 624 that will send an electrical signal from the CMOS layer 604 to the electrode layer 608, which will further be applied to piezoelectric layer 614. As shown by PMUT structure 600 with transmit configuration 624, some devices may be associated with a ground while others are configured to transmit signals. In some embodiments, the second type of via 620 may be associated with a receive configuration 626 that will receive the electrical signal from the piezoelectric layer 614 that originates in response to contact between a finger and the PMUT structure 600. As depicted in FIG. 6, the receive configuration 626 can be switched to a ground position such that it will not mistakenly receive any electrical signal generated in response to the mechanical stress caused by the vibrations that are generated by a neighboring PMUT device. Switching components within the CMOS layer 604 of the MEMS sensor may configure the PMUT structure 600 to operate in a receive mode. To operate in a receive mode, the devices in transmit configuration 624 that were once associated with a transmit function may be switched to be associated with a ground and the devices in the receive configuration 626 that were once associated with a ground may be switched to be associated with a receive function.

Around an array of devices in PMUT structure 600, there may be a recess area 628 that is a part of a MEMS seal ring 630. The MEMS seal ring provides an area to section the PMUT structure 600. For example, the PMUT structure 600 can be sectioned by a cut anywhere in the MEMS seal ring 630 such that the devices shown in FIG. 6 can be part of a user device separate from devices, not depicted, on the other side of the sectioning. The MEMS seal ring 630 may be grounded by associating the contact 616 on the CMOS layer 604 with ground.

Figure 7:
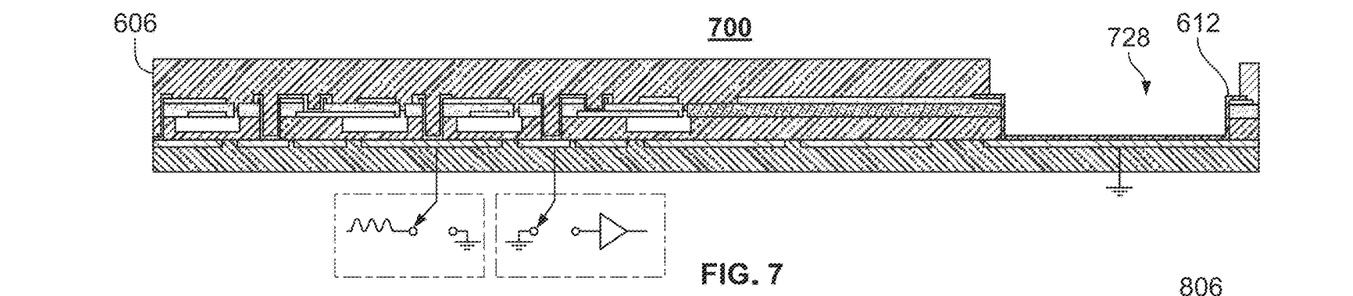
FIG. 7 shows a cross-sectional view of a piezoelectric PMUT structure with an exposed electrode layer in accordance with one embodiment of the present disclosure.

FIG. 7 shows a cross-sectional view of a piezoelectric PMUT structure 700 with an exposed electrode layer 612 in accordance with one embodiment of the present disclosure. The piezoelectric PMUT structure 700 may be obtained from piezoelectric PMUT structure 600 by etching the silicon oxide of the silicon device layer 606. The etch may create a recess area 728 that exposes the electrode layer 612. This exposure can be critical to establishing a conductive path to ground by contacting the electrode layer 614 which can be composed of a conductive metal such as platinum.

Figure 8:
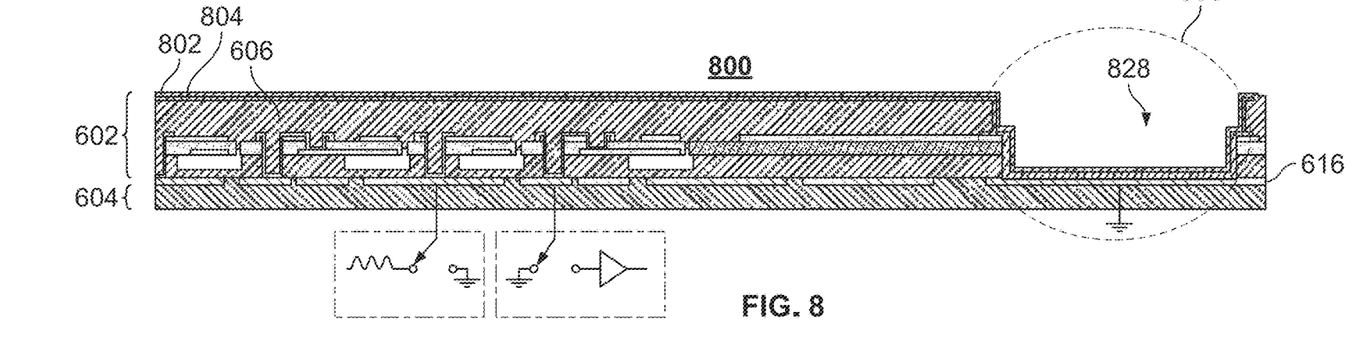
FIG. 8 shows a cross-sectional view of a piezoelectric PMUT structure with a shielding electrode and a dielectric passivation layer in accordance with some embodiments of the present disclosure.

FIG. 8 shows a cross-sectional view of a piezoelectric PMUT structure 800 with a shielding electrode 804 and a dielectric passivation layer 802 in accordance with some embodiments of the present disclosure. The piezoelectric PMUT structure 800 may be obtained from piezoelectric PMUT structure 700 by applying two additional masks or layers. A first mask can be a shielding electrode layer 804 composed of any conductive material. In some embodiments, the shielding electrode layer 804 is placed for EMI shielding over the dielectric vibrating membrane area. The shielding electrode 804 may connect to the contacts 616 of the CMOS layer 604 through a third type of via 806. In some embodiments, the third type of via connects the shielding electrode 804 to electrical ground.

The shielding electrode 804 may be covered with a dielectric passivation layer 802. Recess area 828 can be obtained from recess area 728 after etching the silicon device layer 606 and after layering the passivation layer 802 and the shielding electrode 804. The dielectric passivation layer 802 may not be necessary for the PMUT structure to function. However, the dielectric passivation layer 802 can be used to prevent corrosion of the shielding electrode 804. The dielectric passivation layer 802 can be composed of a metal oxide or a silicon oxide or silicon nitride or any other dielectric material.

Figure 9:
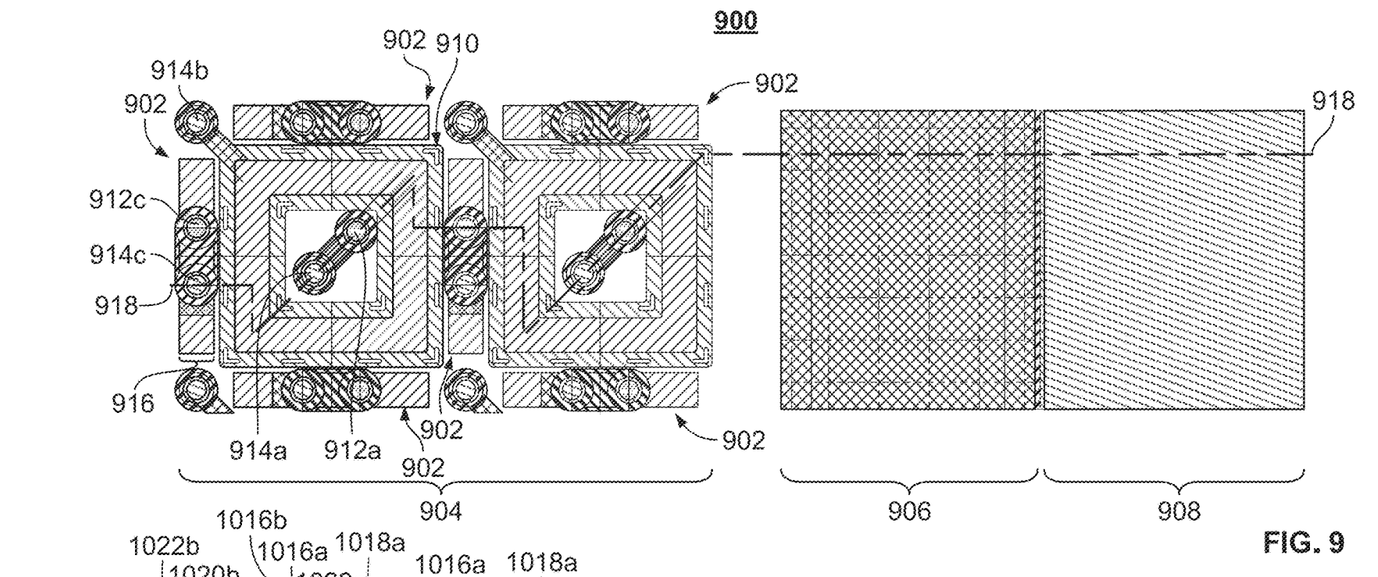
FIG. 9 shows a top view of a PMUT structure with an EMI shielding mesh in accordance with some embodiments of the present disclosure.

FIG. 9 shows a top view of a PMUT structure 900 with an EMI shielding mesh 902 in accordance with some embodiments of the present disclosure. In some embodiments, the PMUT structure 900 comprises an active area 904, a MEMS seal ring 908, and a region 906 separating the active area 904 from the MEMS seal ring 908. The active area 904 may further comprise PMUT devices and an EMI shielding mesh 902. One device 910 of the PMUT devices may comprise a first type of via 912a and a second type of via 914a on a standoff, wherein the standoff can be composed of an insulating material such as silicon oxide or silicon nitride and functions to separate the CMOS layer and the MEMS layer. In another embodiment first type of via 912a can be formed between the first and second electrodes, and formed outside the standoff. The device 910 may also comprise a second type of via 914b at a standoff located between devices.

The EMI shielding mesh 902 may reduce the effects of EMI on the active components of the PMUT devices by providing a path to ground for some of the incoming EMI. The EMI shielding mesh 902 can comprise a first type of via and a second type of via such that any unwanted signal that contacts either a first electrode or a second electrode that are both electrically connected to the two types of via structures may be transmitted directly to ground instead of affecting neighboring active devices. The active devices may be involved in either transmitting or receiving electrical signals, which are ideally free from interference that may reduce the accuracy of the information gleaned from the electrical signals generated in response to mechanical stress applied to the PMUT devices and thereby reducing the robustness of a biometric reading such as a fingerprint reading.

Figure 10:
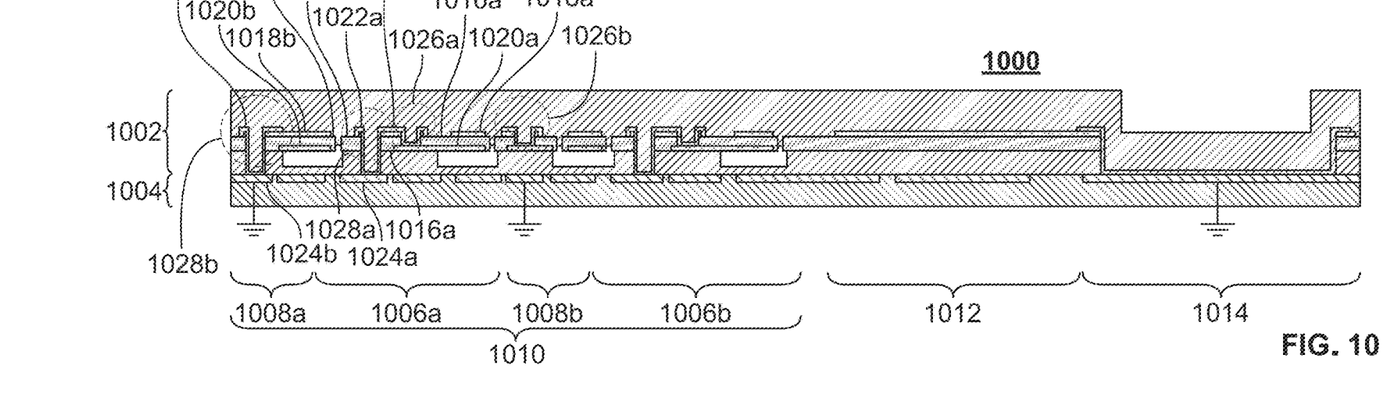
FIG. 10 shows a cross-sectional view of a PMUT structure with an EMI shielding mesh in accordance with some embodiments of the present disclosure.

FIG. 10 shows a cross-sectional view of PMUT structure 1000 with an EMI shielding mesh in accordance with some embodiments of the present disclosure. The cross-sectional view of PMUT structure 1000 can be obtained by following the cut 918 of FIG. 9. The PMUT structure 1000 can be formed by forming a MEMS layer 1002 over an electrical component layer (e.g., CMOS layer 1004). The PMUT structure 1000 can comprise PMUT devices 1006a and/or 1006b, and EMI shielding mesh 1008a and/or 1008b. The area comprised of at least the PMUT devices 1006a and/or 1006b and EMI shielding mesh 1008a and/or 1008b can be referred to as an active region 1010. The PMUT structure 1000 may further comprise a MEMS seal ring 1014, and a region 1012 to separate the active region 1010 from the MEMS seal ring 1012.

In some embodiments, the active region 1010 comprises a piezoelectric layer 1016 between a first electrode 1018a and a second electrode 1020a. At standoffs of a device in the PMUT devices, there may be a third electrode 1022a that contacts the contact 1024a of the CMOS that completes a path for an electrical signal associated with either a receive or transmit function. For example, though not depicted in FIG. 10, the contact 1024a can receive an electrical signal generated between the first electrode 1018a and the second electrode 1020a in response to mechanical stress applied to the piezoelectric layer 1016a. The electrical signal may travel through the third electrode 1022a that allows for a first type of via 1026a and a second type of via 1028a within the standoff central to the PMUT device 1006a. Similarly, though not shown in FIG. 10, a standoff located between PMUT devices may be associated with a transmit function. For example, a second type of via may electrically connect a first electrode of the MEMS layer 1002 to a contact of the CMOS layer 1004. In some instances, an electrical signal is transmitted from the CMOS layer 1004 to the first electrode. The electrical signal may then travel through the conductive piezoelectric layer to a second electrode. As a reaction to the electrical signal between the first electrode and the second electrode, the piezoelectric layer can generate a mechanical response (e.g., a vibration).

The active region 1010 may further comprise an EMI shielding mesh 1008a and/or 1008b. The EMI shielding mesh 1008a can comprise a first electrode 1018b, a second electrode 1020b, a piezoelectric layer 1016b, a third electrode 1022b, and a contact 1024b in the CMOS layer 1004 that is associated with ground. In one instance, when the EMI shielding mesh 1008a is exposed to EMI, an unwanted electrical signal may be received by the first electrode 1018b and/or the second electrode 1020b. Further in this instance, the unwanted electrical signal travels through the third electrode 1022b that is a component of the second type of via 1028b electrically connecting the first electrode 1018b to the contact 1024b of the CMOS layer 1004 associated with ground. The unwanted electrical signal may also travel through the third electrode 1022b that is also a component of a first type of via, though not pictured in FIG. 10, that is electrically connected to the second type of via 1028b. In this way, the EMI acting on the PMUT structure 1000 is reduced at least in part by the grounded EMI shielding mesh 1008a.

The first type of via 1026b shown in the cross-section can be electrically connected to a second type of via (not pictured in this figure). Similarly, the second type of via 1028b shown in the cross-section can be electrically connected to a first type of via (not pictured in this figure). The proximity of the two types of via structures can be more clearly seen in FIG. 9 (e.g., first type of via 912c and second type of via 914c).

The MEMS seal ring 1014 may be separated from the active region 1010 by a region 1012. In some embodiments, the region 1012 may serve to maintain structural integrity at the active region 1010 when the PMUT devices are sectioned by a cut. For example, the PMUT structure 1000 can be sectioned by a cut outside the MEMS seal ring 1014 such that the PMUT devices 1006a and/or 1006b can be part of a user device separate from devices, not depicted, on the other side of the sectioning. The MEMS seal ring 1014 may be grounded.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. An array of piezoelectric micromachined ultrasound transducer (PMUT) devices, comprising:
    an electrical component layer;
    a plurality of PMUT transceivers, wherein each of the plurality of PMUT transceivers comprises:
        a piezoelectric layer and a structural layer, wherein the piezoelectric layer is located between the electrical component layer and the structural layer;
        a first electrode electrically connected to the electrical component layer and the piezoelectric layer, wherein the first electrode is located between the structural layer and the piezoelectric layer; and
        a second electrode electrically connected to the electrical component layer and the piezoelectric layer, wherein the second electrode is located between the electrical component layer and the piezoelectric layer; and
    a conductive layer located above the piezoelectric layer and within the structural layer.

2. The array of PMUT devices of claim 1, wherein the conductive layer at least partially covers the structural layer.

3. The array of PMUT devices of claim 2, wherein the conductive layer at least partially covers an upper surface of the structural layer.

4. The array of PMUT devices of claim 3, wherein the conductive layer substantially covers all of the upper surface of the structural layer.

5. The array of PMUT devices of claim 3, wherein the conductive layer comprises an electromagnetic interference (EMI) layer.

6. The array of PMUT devices of claim 5, further comprising an oxide layer between the structural layer and the EMI layer.

7. The array of PMUT devices of claim 6, further comprising a passivation layer covering the EMI layer.

8. The array of PMUT devices of claim 3, wherein the conductive layer comprises a patterned layer.

9. The array of PMUT devices of claim 8, wherein the patterned layer comprises a plurality of slots at least partially covering the upper surface of the structural layer.

10. The array of PMUT devices of claim 1, wherein the conductive layer comprises a ground shield.

11. The array of PMUT devices of claim 1, wherein the conductive layer comprises a ground mesh.

12. The array of PMUT devices of claim 1, wherein the conductive layer is located between the piezoelectric layer and the structural layer.

13. The array of PMUT devices of claim 12, wherein the conductive layer is located in a shared plane with the first electrodes.

14. The array of PMUT devices of claim 12, wherein the conductive layer comprises a patterned layer.

15. The array of PMUT devices of claim 1, wherein each of the plurality of PMUT transceivers is configured to operate in either a transmit mode or a receive mode.

16. The array of PMUT devices of claim 1, wherein the electrical component layer comprises a CMOS layer.

17. An array of piezoelectric micromachined ultrasound transducer (PMUT) devices, comprising:
    an electrical component layer;
    a plurality of PMUT transceivers, wherein each of the plurality of PMUT transceivers comprises:
        a piezoelectric layer and a structural layer, wherein the piezoelectric layer is located between the electrical component layer and the structural layer;
        a first electrode electrically connected to the electrical component layer and the piezoelectric layer, wherein the first electrode is located between the structural layer and the piezoelectric layer;
        a second electrode electrically connected to the electrical component layer and the piezoelectric layer, wherein the second electrode is located between the electrical component layer and the piezoelectric layer; and
        a conductive layer located in a shared plane with the second electrode.

18. The array of PMUT devices of claim 17, wherein the conductive layer comprises an electromagnetic interference layer.

19. The array of PMUT devices of claim 17, wherein the conductive layer comprises a patterned layer.

20. The array of PMUT devices of claim 17, wherein the conductive layer comprises a ground mesh.

* * * * *